(12) United States Patent
Kim

(10) Patent No.: US 8,323,066 B2
(45) Date of Patent: Dec. 4, 2012

(54) METHOD OF MANUFACTURING FLEXIBLE DISPLAY DEVICE

(75) Inventor: Ock Hee Kim, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 304 days.

(21) Appl. No.: 12/625,018

(22) Filed: Nov. 24, 2009

(65) Prior Publication Data

US 2010/0279576 A1   Nov. 4, 2010

(30) Foreign Application Priority Data

Apr. 30, 2009   (KR) .................. 10-2009-0038131

(51) Int. Cl.
*H01J 9/00*   (2006.01)
*H01L 51/56*   (2006.01)

(52) U.S. Cl. ............ 445/25; 445/24; 439/187; 439/190; 156/156; 156/382

(58) Field of Classification Search .................. 445/24, 445/25; 349/187–192; 156/156, 60, 538, 156/556, 510, 382, 379.7
See application file for complete search history.

(56) References Cited

U.S. PATENT DOCUMENTS

| | | | | |
|---|---|---|---|---|
| 4,362,771 A | * | 12/1982 | Umeda et al. ............ | 428/1.6 |
| 5,499,127 A | * | 3/1996 | Tsubota et al. ........... | 349/153 |
| 6,290,793 B1 | * | 9/2001 | Lovas et al. .............. | 156/99 |
| 7,025,650 B2 | * | 4/2006 | Matsuoka et al. ........ | 445/25 |
| 2004/0023591 A1 | | 2/2004 | Matsuoka et al. | |
| 2011/0192525 A1 | * | 8/2011 | Kondo et al. ............. | 156/99 |

FOREIGN PATENT DOCUMENTS

| | | | |
|---|---|---|---|
| CN | 1469172 A | | 1/2004 |
| JP | 04060513 A | * | 2/1992 |

OTHER PUBLICATIONS

Office Action issued in corresponding Chinese Patent Application No. 200910204192.7, mailed Dec. 7, 2011.
Office Action issued in corresponding Chinese Patent Application No. 200910204192.7, mailed Jul. 23, 2012.

* cited by examiner

*Primary Examiner* — Mariceli Santiago
(74) *Attorney, Agent, or Firm* — Brinks Hofer Gilson & Lione

(57) ABSTRACT

A method of manufacturing a flexible display device is disclosed. The flexible display device manufacturing method includes: preparing a support substrate; coating a sealant on edge areas of the support substrate; combining a flexible substrate and the support substrate coated with the sealant in a vacuum state; hardening the sealant between the support substrate and the flexible substrate; forming display components used in a configuration of the flexible display device on the flexible substrate; and cutting the flexible substrate along a cutting line on the flexible substrate to separate the flexible substrate from the support substrate.

9 Claims, 10 Drawing Sheets

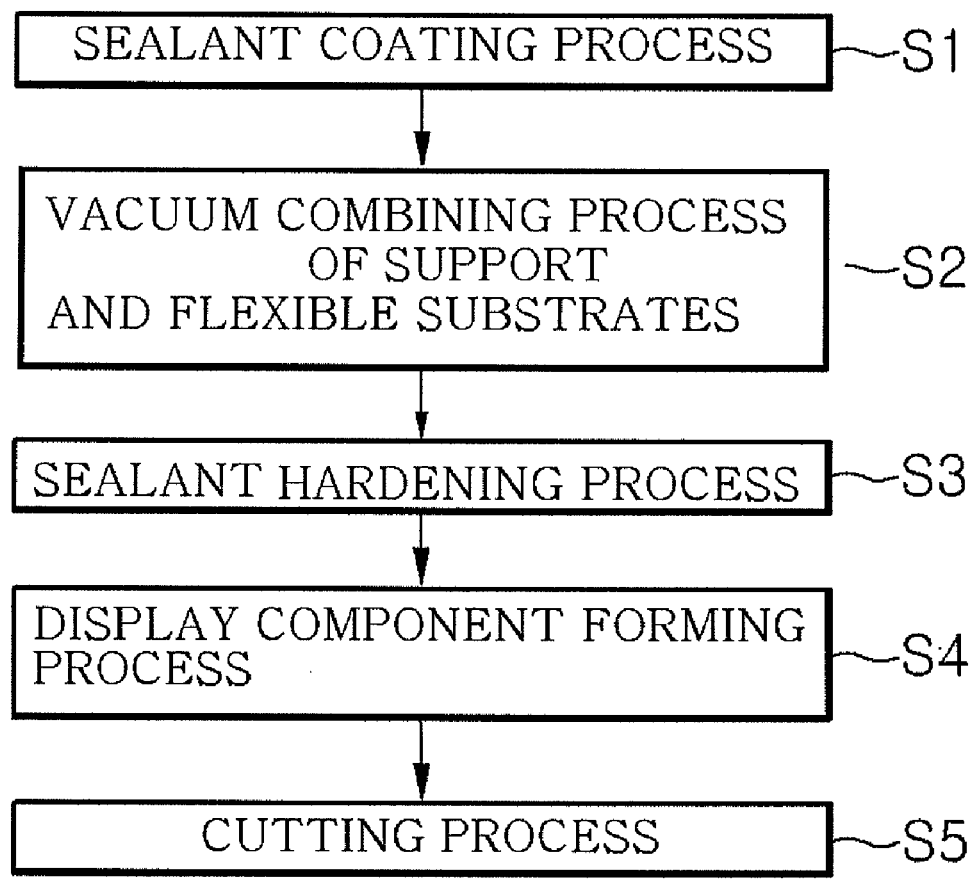

FIG. 7A
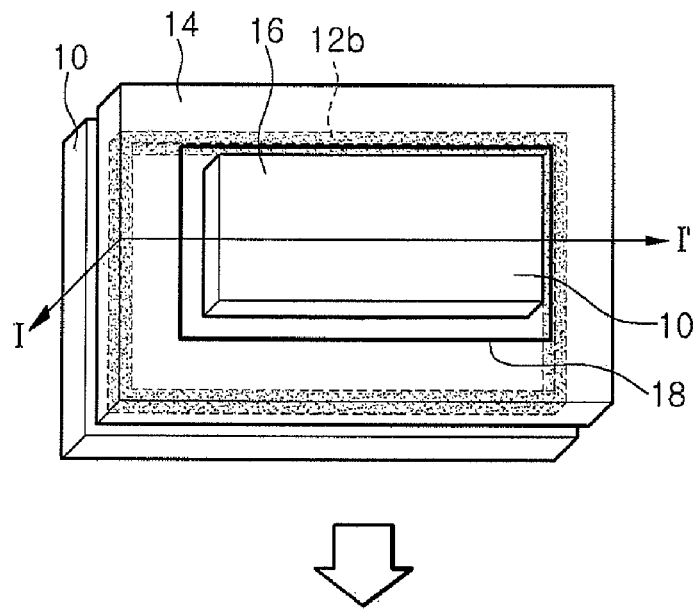
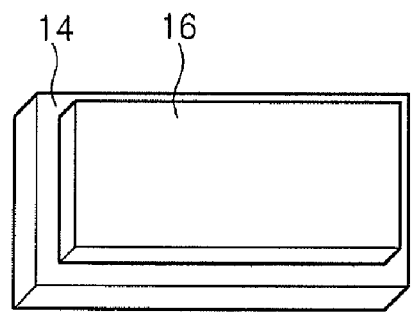
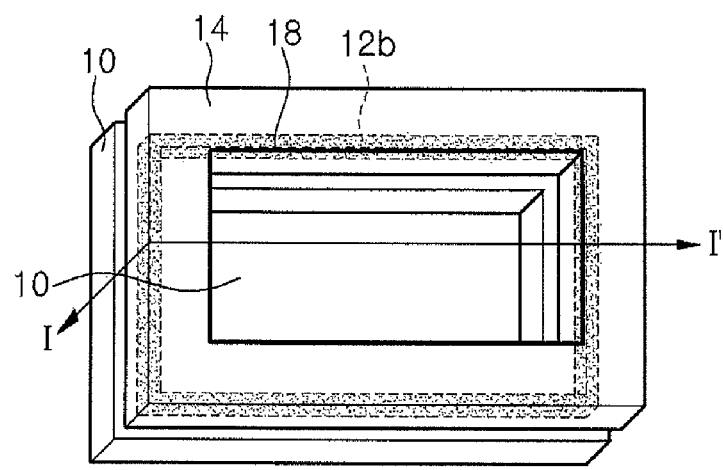

FIG. 7B
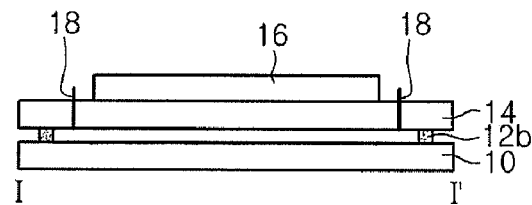
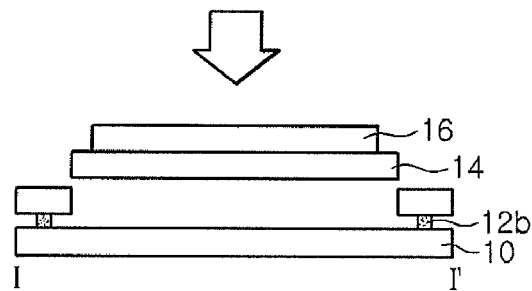
FIG. 8A
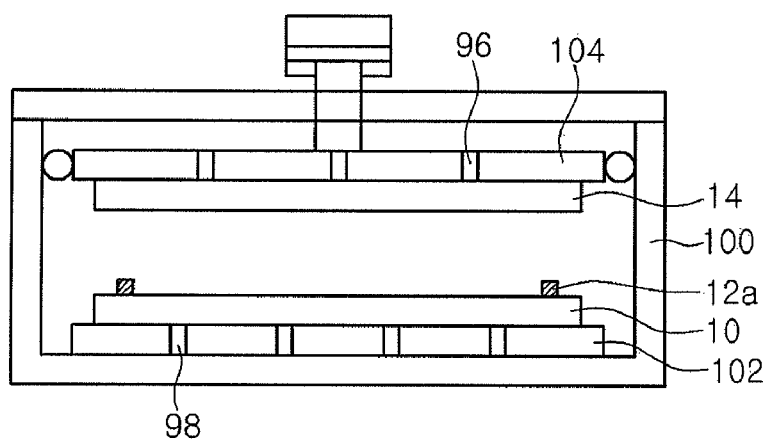
FIG. 8B
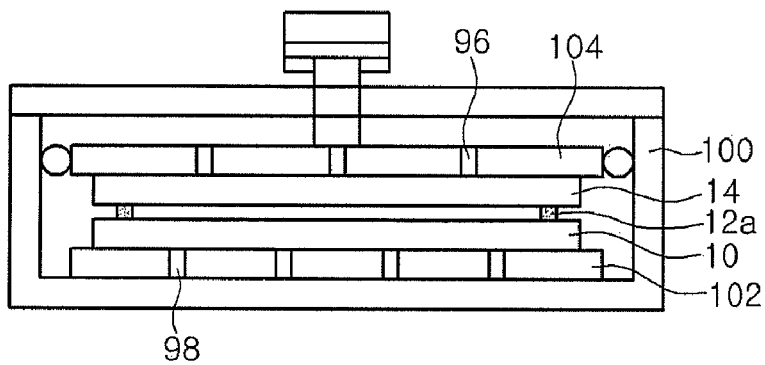

FIG. 11
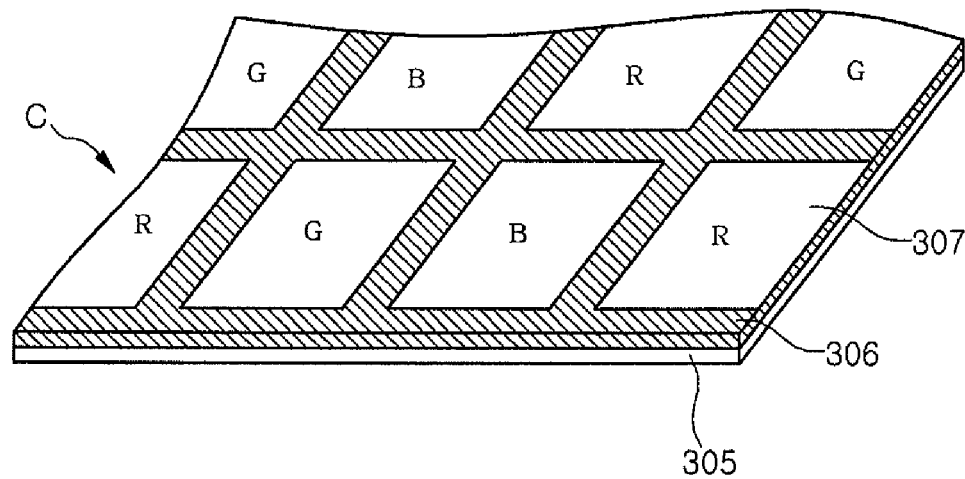
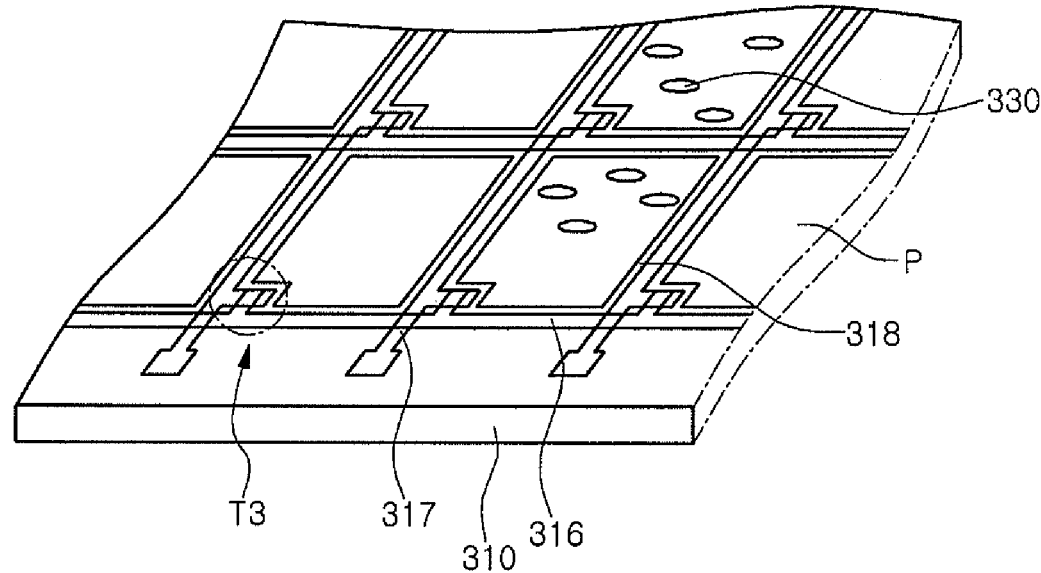

METHOD OF MANUFACTURING FLEXIBLE DISPLAY DEVICE

This application claims the benefit of Korea Patent Application No. 10-2009-0038131, filed on Apr. 30, 2009, the entire contents of which is incorporated herein by reference for all purposes as if fully set forth herein.

BACKGROUND

1. Field of the Invention

This disclosure relates to a method of manufacturing a display device, and more particularly to a method of manufacturing a flexible display device.

2. Discussion of the Related Art

Recently, flat panel display (FPD) devices with light weight and thin size have been popularly and rapidly developed instead of cathode ray tubes (CRTs). The FPD devices include liquid crystal display (LCD) devices, field emission display (FED) devices, plasma display panels (PDPs), light emitting diode (LED) display devices, and others.

The FPD devices are almost generally manufactured through a high temperature process. As such, heat-resistant glass is used as substrates for the FPD devices. There is a limitation in reducing the thickness of the glass substrate. Additionally, although the glass substrate becomes thinner, the thin glass substrate without flexibility may be easily broken.

In view of this, a flexible display device has recently been proposed which employs a thin material with durability and flexibility, such as plastic, metal foil, and others, instead of the glass that lacks durability and flexibility, as its substrate. The flexible display device can constantly maintain a display performance even though it is bent as if paper is folded.

The use of a plastic or metal foil substrate thinner than the glass substrate forces the flexible display device to become thinner and more pliable in comparison with the FPD devices. The lower-price of the plastic or metal foil substrate compared to the glass substrate enables the flexible display device to be easily applied to various uses in comparison with the related art FPD devices. As such, the flexible display device has a good future as a next-generation display device. Accordingly, technologies of manufacturing the flexible display device have recently been actively developed.

On the other hand, the substrate of the flexible display device is easy to change during a manufacturing process due to its pliability. As such, it is very difficult for the pliable substrate to accurately perform the manufacturing process of the flexible display device. To address this matter, a manufacturing method of the flexible display device has been proposed which includes processes of fastening a flexible substrate to a support substrate using an adhesive material, forming display components on the flexible substrate, and then peeling off the flexible substrate from the support substrate.

FIGS. 1A to 1C are perspective views schematically explaining a flexible display device manufacturing method of the related art. Referring to FIGS. 1A to 1C, the related art method of manufacturing a flexible display device includes processes of fastening a flexible substrate 5 to a support substrate 1 by means of an adhesive material 3, forming circuit elements 7 on the flexible substrate 5, and then removing the adhesive material 3 and the support substrate 1 from the flexible substrate 5.

More specifically, the flexible substrate 5 is attached to the support substrate 1 using the adhesive material 3 as shown FIG. 1A. As such, the support substrate 1 stably supports the flexible substrate 5 which is firmly fastened to it by the adhesive material 3. Accordingly, the flexible substrate 5 can be easily handled.

Subsequently, display components 7 are formed on the flexible substrate 5 supported by the support substrate 1, as shown in FIG. 1B. The display components 7 are configured to include a variety of signal lines and a thin film transistor array. As such, the display components can be formed by repeatedly performing a patterning process which includes cleaning, thin film depositing, photo resist forming, etching, and others.

The adhesive material 3 and the support substrate 1 are removed from the flexible substrate on which the display components 7 including the signal lines and the thin film transistor array are formed, as shown in FIG. 1C. Therefore, the display components 7 are supported only by the flexible substrate 5.

The adhering process included in the related art method of manufacturing a flexible display device forces the flexible substrate 5 to be entirely adhered to the support substrate 1. As such, it makes it difficult to peel off the flexible substrate 5 from the support substrate 1. Also, the residuals of the adhesive material 3 can remain on the flexible substrate 5 after peeling off the flexible substrate 5 from the support substrate 1. Due to this, an additional cleaning process is necessary to remove the residuals of the adhesive material 3.

Moreover, the flexible substrate 5 must be bent by an upward force applied during the peeling off process which is included in the related art method of manufacturing the flexible display device. As such, some parts of the display components 7, such as thin film patterns, can be damaged when the flexible substrate 5 is peeled off from the support substrate 1. The thin film patterns damaged during the peeling off process cause the reliability of the flexible display device to be deteriorated.

BRIEF SUMMARY

A flexible display device manufacturing method includes: preparing a support substrate; coating a sealant on edge areas of the support substrate; combining a flexible substrate and the support substrate coated with the sealant in a vacuum state; hardening the sealant between the support substrate and the flexible substrate; forming display components used in a configuration of the flexible display device on the flexible substrate; and cutting the flexible substrate along a cutting line on the flexible substrate to separate the flexible substrate from the support substrate.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings:

FIG. 2 is a flow chart explaining a method of manufacturing a flexible display device according to a first embodiment of the present disclosure;

FIGS. 3A and 3B to 7A and 7B are views illustrating a method of manufacturing a flexible display device according to a first embodiment of the present disclosure;

FIGS. 8A and 8B are cross-sectional views showing a vacuum combiner used in a flexible display device manufacturing method according to an embodiment of the present disclosure;

FIGS. 9 to 11 are views illustrating in detail flexible display devices manufactured by a method according to an embodiment of the present disclosure;

DETAILED DESCRIPTION OF THE DRAWINGS AND THE PRESENTLY PREFERRED EMBODIMENTS

Figure 1A:
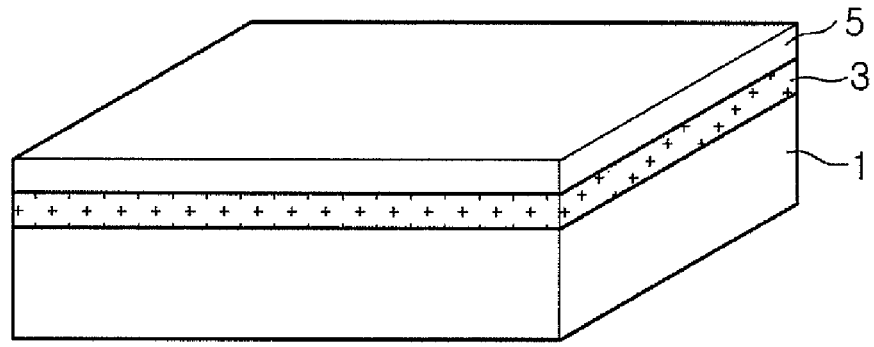
FIGS. 1A to 1C are perspective views schematically explaining a flexible display device manufacturing method of the related art.
Figure 1B:
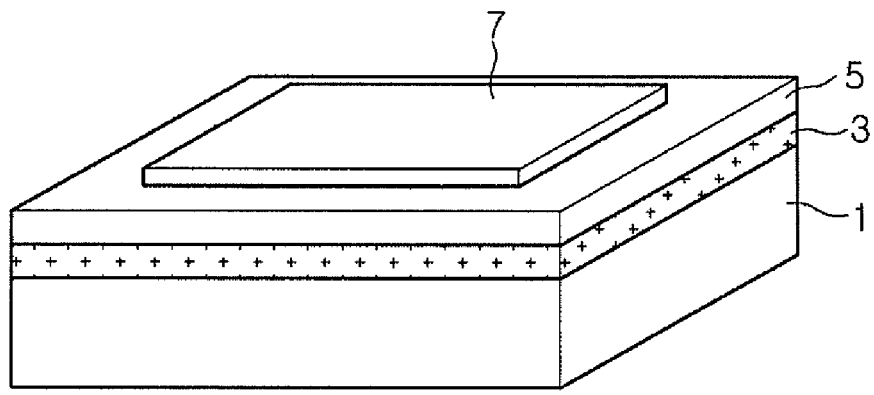
Figure 1C:
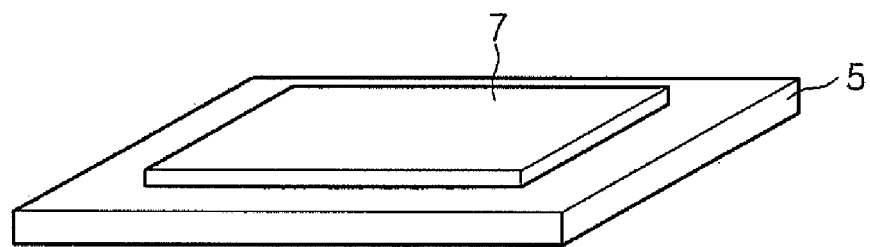

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Hereinafter, a manufacturing method of the flexible display device according to a first embodiment of the present disclosure will be described with reference to attached drawings.

FIG. 2 is a flow chart illustrating a manufacturing method of the flexible display device according to a first embodiment of the present disclosure. Referring to FIG. 2, a manufacturing method of the flexible display device according to a first embodiment of the present disclosure can be defined into a sealant coating process S1, a process S2 of combining a support substrate and a flexible substrate, a sealant hardening process S3, a display component forming process S4, and a cutting process S5.

The flexible display device manufacturing method of FIG. 2 will now be explained in detail with reference to FIGS. 3A and 3B to 7A and 7B. FIGS. 3B, 4B, 5B, 6B, and 7B are cross-sectional views taken along lines I-I' in FIGS. 3A, 4A, 5A, 6A, and 7A.

Figure 3A:
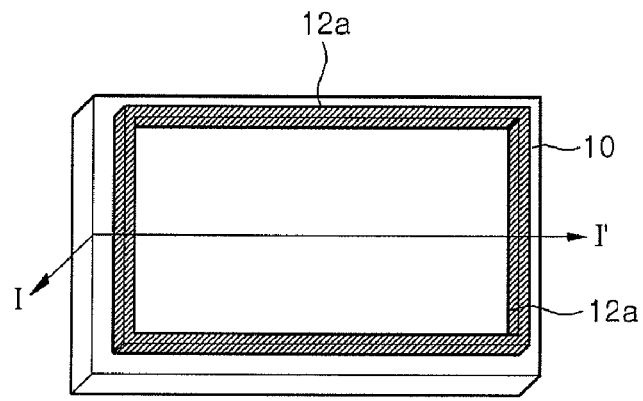
Figure 3B:
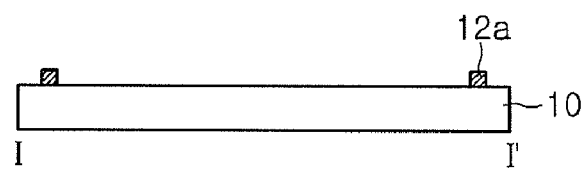

As shown in FIGS. 3A and 3B, the sealant coating process S1 which coats a sealant 12a on a support substrate 10 is performed first. More specifically, the sealant coating process dispenses the sealant 12a in a fixed width on the edge areas of the support substrate 10 using a dispenser. An example of the sealant 12a is any one of a UV sealant and a heat hardening sealant. A rigid substrate such as a glass substrate is used as the support substrate 10, in order to fasten a flexible substrate 14, which is easy to change in shape, to be attached to the support substrate 10.

Figure 12A:
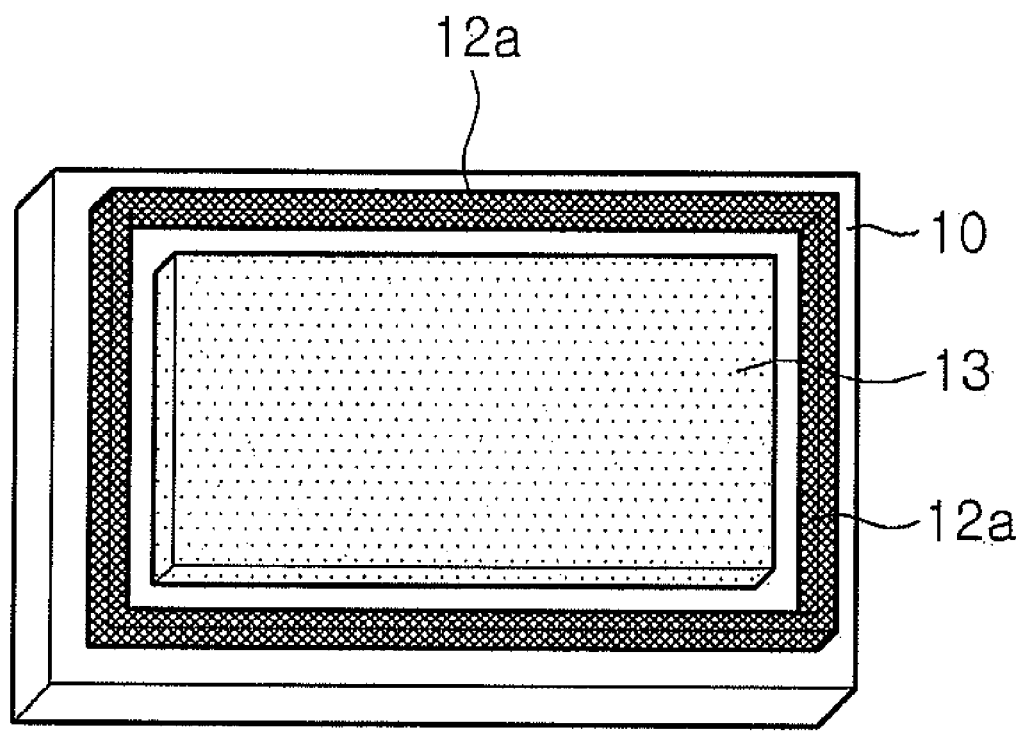
FIGS. 12A and 12B are views illustrating a method of manufacturing a flexible display device according to a second embodiment of the present disclosure.
Figure 12B:
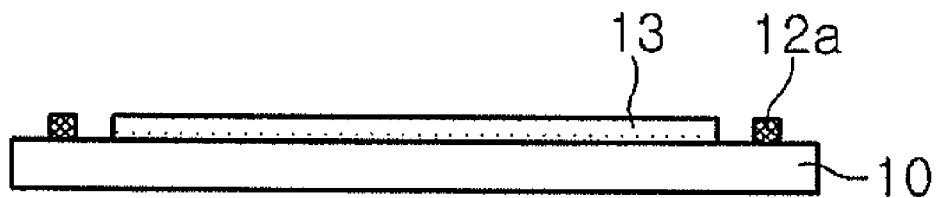

After coating the sealant 12a on the support substrate 10, a spacer film 13 can be further formed on a center area of the support substrate 10 in which the sealant 12a is not coated, as shown in FIGS. 12A and 12B. The spacer film 13 prevents the flexible substrate 14 from sagging during the vacuum combining process which will be performed later. In other words, the spacer film 13 is used in the surface planarization of the flexible substrate 14.

Figure 4A:
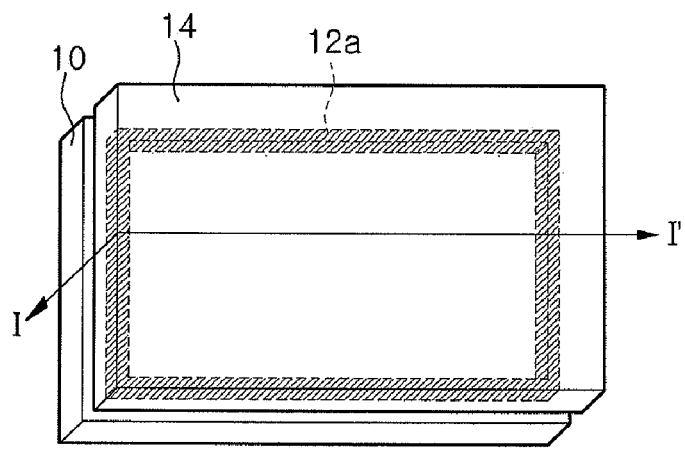
Figure 4B:
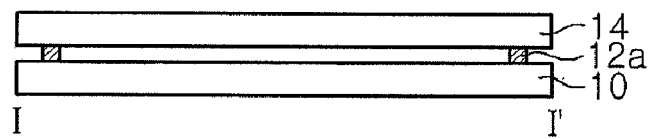

As shown in FIGS. 4A and 4B, the vacuum combining process S2 is performed which combines the flexible substrate 14 onto the support substrate 10 coated with the sealant 12a in a vacuum state. The vacuum combining process S2 is used for eliminating air existing in a center space not coated with the sealant 12a when the flexible substrate 14 is combined with the support substrate 10. This results from the fact that the air existing between the support and flexible substrates 10 and 14 causes defects to be generated in later processes. The flexible substrate 14 is formed in a thickness range of about 50~500 μm. The flexible substrate 14 can be formed from either a metal foil, which contains stainless steel and others, or a plastic film which contains polyethersulfone (PES), polyethylenenaphthalate (PEN), polyethylene terephthalate (PET), polycarbonate (PC), and others.

The vacuum combining process S2 is performed by a vacuum combiner 100 shown in FIGS. 8A and 8B. Referring to FIG. 8A, the support substrate 10 coated with the sealant 12a is placed on a lower absorptive member 102 movable in a horizontal direction within the vacuum combiner 100 and is secured by vacuum absorptive forces generated in lower intake holes 98. On the other hand, the upper surface of the flexible substrate 14 is absorbed to entirely close to an upper absorptive member 104 by the vacuum absorptive forces generated in upper intake holes 96 and to be secured to the upper absorptive member 104. Then, the vacuum combiner 100 is closed and makes its inner side into a vacuum state.

Subsequently, the upper absorptive member 104 drops perpendicularly so that the flexible substrate 14 is positioned near to the support substrate 10. The lower absorptive member 102 also moves in the horizontal direction in order to accurately align the support substrate 10 in opposition to the flexible substrate 14. Thereafter, the upper absorptive member 104 drops perpendicularly to make contact with the flexible substrate 14 with the sealant 12a on the support substrate 10, again. Moreover, the upper absorption member further drops perpendicularly to apply a pressure on the flexible substrate 14, so that the flexible substrate 14 is firmly combined with the support substrate 10 by means of the sealant 12a as shown in FIG. 8B.

In this manner, the vacuum combining process S2 for combining the flexible substrate 14 with the support substrate 10 by the sealant 12a in the vacuum state is completed using the vacuum combiner 100.

Figure 5A:
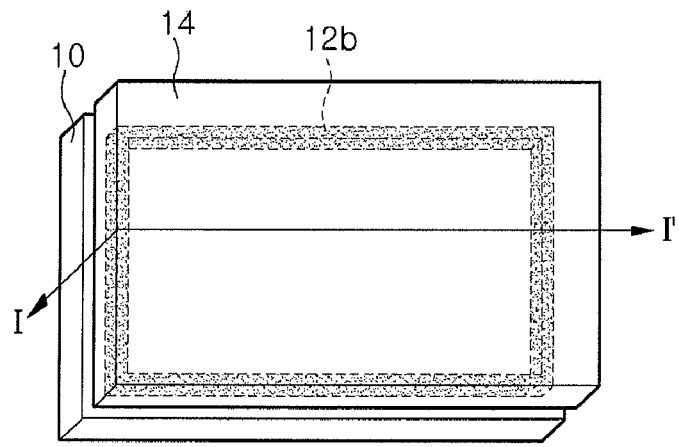
Figure 5B:
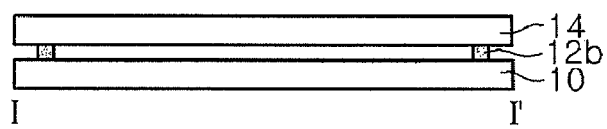

As shown in FIGS. 5A and 5B, the sealant hardening process S3 is performed which hardens the sealant 12a between the support substrate 10 and the flexible substrate 14. As such, the sealant 12a becomes a hardened sealant 12b. Such a sealant hardening process is completed by feeding the flexible substrate 14 combined with the support substrate 10 from the vacuum combiner 100 to a sealant hardening apparatus (not shown), exposing only the sealant 12a using a mask, and then irradiating heat or UV light to only the exposed sealant 12 to be hardened. Consequently, a dummy area of the flexible substrate 14 is combined with only the edge area of the support substrate 10 by means of the hardened sealant 12b on the edge area of the support substrate 10. In other words, the flexible substrate 14 is not combined with the rest area of the support substrate 10 which is not covered with the hardened sealant 12b and is opposite to a space of the vacuum state.

Subsequently, the display component manufacturing process S4 is performed which forms a variety of signal lines and a thin film transistor array which configure the flexible display device, as shown FIGS. 6A and 6B. For example, if the flexible display device corresponds to an electrophoretic display device, display components shown in FIG. 9 can be formed through the display device manufacturing process S4.

Figure 9:
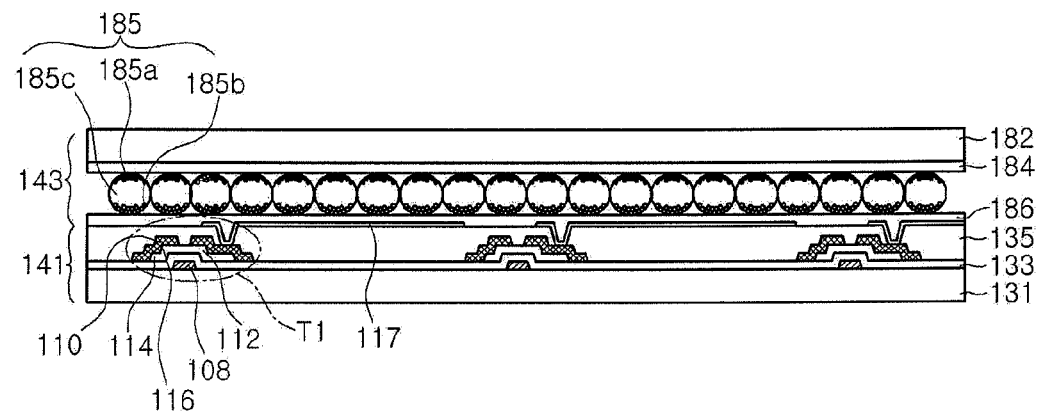

The electrophoretic display device manufactured through the display device manufacturing process will now be described in detail with reference to FIG. 9. The electrophoretic display device is divided into a lower array unit 141 and an upper array unit 143.

The upper array unit 143 is generally flexible. This upper array unit 143 includes an upper electrode 184 formed on a base film 182, and capsules 185 placed on the upper electrode 184 and configured to each include charged pigment particles. The base film 182 is formed from any one of a pliable plastic material, a flexible metal material, and others. Each of the capsules 185 includes black pigment particles 185a reacting to a positive polarity voltage, white pigment particles 185b reacting to a negative polarity voltage, and a solvent 185c.

The lower array unit 141 includes gate and data lines (not shown) formed to cross each other in the center of a gate insulation film 133 on a lower substrate 131, a thin film transistor (TFT) T1 formed at each intersection of the gate and data lines, and a pixel electrode 117 formed on each cell region defined by the crossing configuration of the gate and data lines. The TFT T1 is configured to include a gate electrode 108, a source electrode 110, a drain electrode 112, an active layer 114, and an ohmic contact layer 116. The pixel electrode 117 is electrically connected to the drain electrode 112 via a contact hole which penetrates through a passivation (or protective) film 135 and partially exposes the drain electrode 112. Such a lower array unit 141 with the above configuration is combined with the upper array unit 143 by means of an adhesive material 112.

Figure 10:
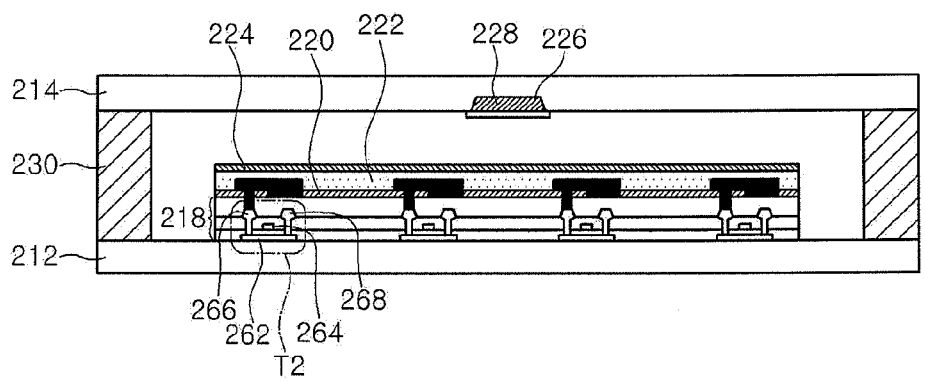

Also, if the flexible display device is an organic electro-luminescent display device, display components shown in FIG. 10 can be formed through the display device manufacturing process S4. The organic electro-luminescent display device manufactured through the display device manufacturing process S4 will now be described in detail with reference to FIG. 10. The organic electro-luminescent display device is produced by combining a first substrate 212, on which an array layer 218 and an organic light emission layer 222 are formed, with a second substrate 214 for an encapsulation.

The array layer 218 is formed on inner surface of the first substrate 212. The array layer 218 is configured to include a plurality of TFTs T2 formed in sub-pixel units. Each of the TFTs T2 is formed to include a semiconductor layer 262, a gate electrode 264, a source electrode 266, and a drain electrode 268. The first substrate 212 further includes first electrodes 220 formed in sub-pixel units on the array layer 218, the organic light emission layer 222 formed on the first electrodes 220, and a second electrode 224 formed on the entire surface of the organic light emission layer 222. The first electrodes are connected to the respective TFT T2. The organic light emission layer 222 emits red, green, and blue color lights in sub-pixel units.

A concave groove 226 is formed in the inner side of the second substrate 214. The second substrate 214 is configured to include a moisture absorbent material 228 sealed into the concave groove 226. The moisture absorbent material 228 prevents the intrusion of external moisture and protects the organic light emission layer 222. The edges of the first and second substrates 212 and 214 are sealed by a sealant 230.

Furthermore, when the flexible display device is an LCD device, display components shown in FIG. 11 can be formed through the display device manufacturing process S4. The LCD device manufactured through the display device manufacturing process S4 will now be described in detail with reference to FIG. 11. The LCD device includes a color filter substrate 305 and an array substrate 310 disposed opposite to each other in the center of a liquid crystal layer 330.

The color filter substrate 305 is configured to include color filters C and a black matrix 306. Each of the color filters C is configured to include red, green, and blue sub-color filters 307. The black matrix 306 divides the sub-color filters from one another and blocks light.

The array substrate 310 includes gate lines 316 and data lines 317 formed in vertical and horizontal directions. The gate lines 316 and the data lines 317 divide the array substrate 310 into sub-pixel regions P. The array substrate 310 further includes TFTs T3 formed at intersections of the gate lines 316 and the data lines 317. The TFTs T3 are used as switching elements. Furthermore, the array substrate 310 includes a pixel electrode 318 and a common electrode (not shown) which are formed at each sub-pixel region P.

The sub-pixel regions P are opposite to the sub-color filters 307 on the color filter substrate 305, respectively. In other words, sub-pixels are formed on the sub-pixel regions P, respectively. One dot of color image is obtained by the combination of three sub-color filters 307 (i.e., the red, green, and blue sub-color filters). As such, one color pixel consists of three sub-pixels (i.e., red, green, and blue sub-pixels). Moreover, the TFTs T3 are connected to the red, green, blue sub-pixels, respectively.

Consequently, a display device formed the flexible substrate 14 can become any one of the electrophoretic display device, the LCD device, the electro-luminescent display device, and others.

Next, the cutting process S5 is performed which cuts the flexible substrate 14 and separates the flexible substrate 14 from the support substrate 10, as shown in FIGS. 7A and 7B. Then, the flexible display device manufacturing process is completed.

The cutting process S5 forces the flexible substrate 14 to be cut along a cutting line 18 defined on its inner side in the center of the sealant 12b which is formed on the dummy area of the flexible substrate 14. When the cutting process is completed, a part of the flexible substrate 14 of which the sealant 12b is not adhered is separated from the support substrate 10. This results in the sealant 12b being formed only on the edge area of the support substrate 10 opposite to the dummy area of the flexible substrate 14. To rectify this, the portion of the flexible substrate with the display components 16 can be separated from the support substrate 10 when the flexible substrate 14 is taken along the cutting line defined on more inner side than the sealant 12b. Such a cutting process can be performed by methods using any one of a scribing wheel, a presser, and others.

In this way, the support substrate 10 and the flexible substrate 14 are adhered to each other only in a part area (i.e., the dummy area). As such, the flexible substrate 14 can be easily separated from the support substrate 10 by cutting off its dummy area. Therefore, the flexible display device manufacturing method according to a first embodiment of the present disclosure can eliminate the adhesive removing process as well as the problem of remaining adhesive, unlike the related art method. Also, it is unnecessary to artificially bend the flexible substrate 10 for the separation thereof. Moreover, the damage of thin film patterns included in the display components which are formed on the flexible substrate 14 can be prevented (or minimized).

Figure 6A:
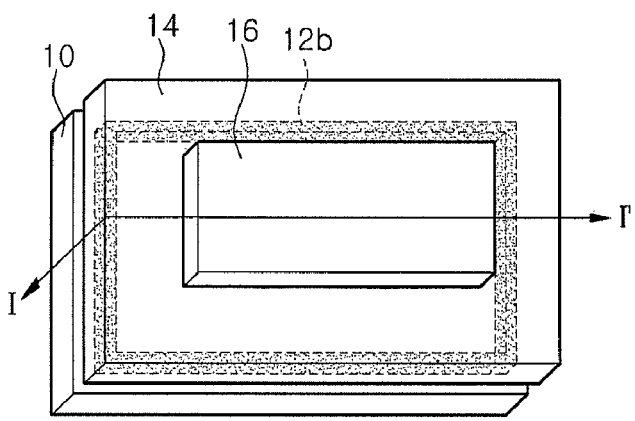
Figure 6B:
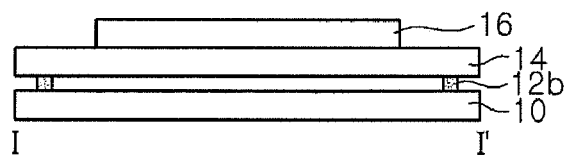
Figure 13:
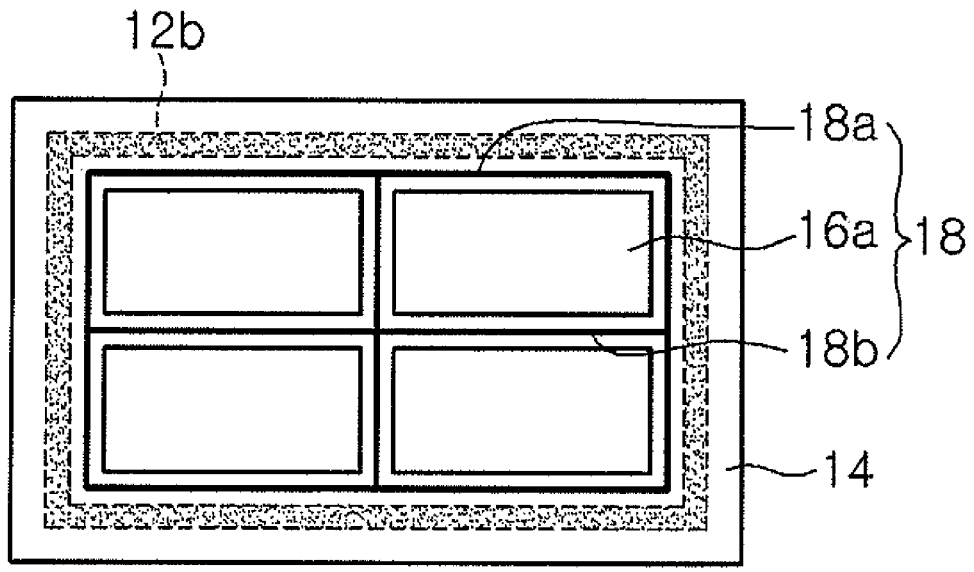
FIG. 13 is a planar view illustrating a method of manufacturing a flexible display device according to a third embodiment of the present disclosure.

The display components can be formed in a plurality of unit panels 16a with the same size on the flexible substrate 14 as shown in FIG. 13, even though the display components on the flexible substrate 14 are formed in a single unit panel as shown in FIGS. 6A and 6B. Alternatively, the display components can be formed in a plurality of unit panels 16b with different sizes on the flexible substrate 14, as shown in FIG. 14.

Figure 14:
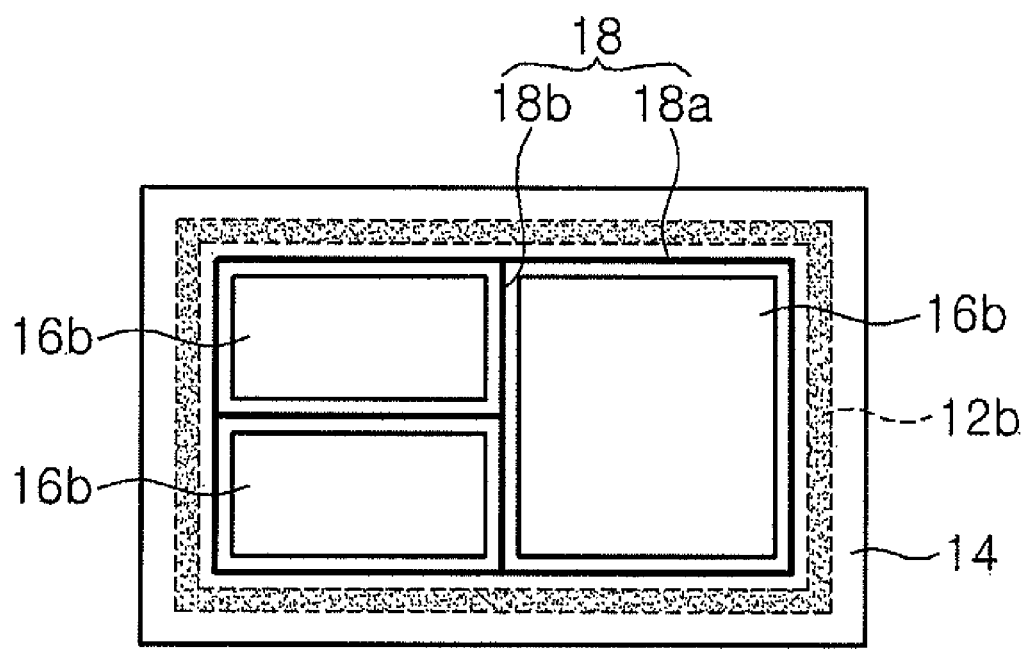
FIG. 14 is a planar view illustrating a method of manufacturing a flexible display device according to a fourth embodiment of the present disclosure.

In these cases, a first cutting line 18a is not only defined at an adjacent inner area in the center of the sealant 12b, but second cutting lines 18b are also defined between the plurality of unit panels 16a and/or 16b, as shown in FIGS. 13 and 14. As such, parts of the flexible substrate 14 each corresponding to the unit panel 16a or 16b can be separated from the support substrate 10 when the flexible substrate 14 is taken along the first and second cutting lines 18a and 18b.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

The invention claimed is:

1. A method of manufacturing a flexible display device, comprising:
   preparing a support substrate;
   coating a sealant on edge areas of the support substrate;
   forming a spacer film on a center area of the support substrate;
   combining a flexible substrate and the support substrate coated with the sealant in a vacuum state to eliminate the air existing between the support and flexible substrates and in a center space not coated with the sealant;
   hardening the sealant between the support substrate and the flexible substrate;
   forming display components used in a configuration of the flexible display device on the flexible substrate; and
   cutting the flexible substrate along a cutting line on the flexible substrate to separate the flexible substrate from the support substrate.

2. The method claimed as claim 1, wherein the support substrate is formed of a rigid substrate material in order to fix the flexible substrate.

3. The method claimed as claim 1, wherein the flexible substrate is formed of any one of polyethersulfone (PES), polyethylenenaphthalate (PEN), polyethylene terephthalate (PET), polycarbonate (PC), or stainless steel, in a thickness range of about 50~500 μm.

4. The method claimed as claim 1, wherein the edge areas of the support substrate are combined with the flexible substrate by the hardened sealant on the edge areas of the support substrate, and the rest area of the support substrate without the sealant is separated from the flexible substrate.

5. The method claimed as claim 1, wherein the cutting line is defined on an inner side in the center of the sealant which is formed on the edge areas of the support substrate.

6. The method claimed as claim 1, wherein the sealant is dispensed on the support substrate using a dispenser and configured to include any one of an UV sealant or a heat hardening sealant.

7. The method claimed as claim 1, wherein the hardening of the sealant is performed by irradiating any one of heat or UV light.

8. The method claimed as claim 1, wherein the display components on the flexible substrate are formed in at least one unit panel.

9. The method claimed as claim 1, wherein the flexible display device corresponds to any one of an electrophoretic display device, an organic electro-luminescent display device, or a liquid crystal display device.

* * * * *